United States Patent [19]

Mohammad

[11] Patent Number: 5,389,562
[45] Date of Patent: Feb. 14, 1995

[54] DOUBLE HETEROJUNCTION BIPOLAR TRANSISTOR AND THE METHOD OF MANUFACTURE THEREFOR

[75] Inventor: S. Noor Mohammad, Hopewell Junction, N.Y.

[73] Assignee: International Business Machines Corporation, Armonk, N.Y.

[21] Appl. No.: 193,685

[22] Filed: Feb. 8, 1994

Related U.S. Application Data

[62] Division of Ser. No. 968,913, Dec. 23, 1992, Pat. No. 5,365,089.

[51] Int. Cl.[6] .......................................... H01L 21/265
[52] U.S. Cl. ...................................... 437/31; 437/133
[58] Field of Search ................ 437/31, 32, 90, 104, 437/107, 126, 133; 148/DIG. 72; 257/586

[56] References Cited

U.S. PATENT DOCUMENTS

| | | | |
|---|---|---|---|
| 4,593,305 | 6/1986 | Kurata et al. | 357/34 |
| 4,617,724 | 11/1986 | Yokoyama et al. | 29/576 B |
| 4,679,305 | 7/1987 | Morizuka | 29/576.3 |
| 4,751,195 | 6/1988 | Kawai | 437/31 |
| 4,768,074 | 8/1988 | Yoshida et al. | 357/34 |
| 4,789,643 | 12/1988 | Kajikawa | 437/31 |
| 4,794,440 | 12/1988 | Capasso et al. | 357/34 |
| 4,903,104 | 2/1990 | Kawai et al. | 357/35 |
| 4,996,166 | 2/1991 | Ohshima | 437/31 |
| 5,010,382 | 4/1991 | Katoh | 357/34 |
| 5,024,958 | 6/1991 | Awano | 437/31 |

OTHER PUBLICATIONS

H. Kroemer, "Theory of Wide-Gap Emitter for Transistors", *Proc. IRE*, vol. 45, pp. 1535-1537 (1957).
A. Das and M. S. Lundstrom, "Numerial Study of Emitter-Base Junction Design for AlGaAs/GaAs Heterojunction Bipolar Transistors," *IEEE Trans. Electron Devices*, vol. ED-35, pp. 863-870 (1988).
S. C. Lee and H. H. Lin, "Transport Theory of the Double Heterojunction Bipolar Transistor Based on Current Balancing Concept", *J. Appl. Phys.*, vol. 59, pp. 1688-1695 (1986).
P. M. Enquist, L. P. Ramberg, L. F. Eastman, "Comparison of Compositionally Grated to Abrupt Emitter--Base Junctions Used in the Heterojunction Bipolar Transistor", *J. Appl. Phys.*, vol. 61, pp. 2663-2669 (1987).
H. Kroemer, "Heterostructure Bipolar Transistors and Integrated Circuits" *Proc. IEEE*, vol. 70, pp. 13-25 (1982).
S. Noor Mohammad, J. Chen, J. I. Chyi, H. Morkoc, "Effect of Junction and Bandgap Grading on the Electrical Performance of Molecular Beam Epitaxial Grown AlGaAs/GaAs/AlGaAs Double-Heterojunction Bipolar Transistors," *Jrnl. Appl. Phys.*, vol. 69, pp. 1067-1070 (1991).
R. L. Anderson, "Experiments in Ge-GaAs Heterojunctions," *Solid-State Electron.*, vol. 3, pp. 341-351 (1962).

*Primary Examiner*—Olik Chaudhuri
*Assistant Examiner*—Brian Dutton
*Attorney, Agent, or Firm*—Charles W. Peterson, Jr.

[57] ABSTRACT

A Double Heterojunction Bipolar Transistor (DHBT) and the method of fabrication therefor. First a layered wafer is prepared on a semi-insulating GaAs substrate. The bottom wafer layer is $n^+$ GaAs, followed by $n_-$ AlGaAs, a thin layer of n AlGaAs (which form the DHBT's collector) and a base layer of $p^+$ GaAS. A layered plug fills a trench etched in the base layer. The bottom two plug layers are AlGaAs and the top plug layer is GaAs. Next, an emitter is ion-implanted into the plug core and an extrinsic base region is ion-implanted. Finally, base, emitter and collector contacts are formed.

11 Claims, 7 Drawing Sheets

5,389,562

DOUBLE HETEROJUNCTION BIPOLAR TRANSISTOR AND THE METHOD OF MANUFACTURE THEREFOR

This is a division of application Ser. No. 07/968,913, filed Dec. 23, 1992, now U.S. Pat. No. 5,365,089.

FIELD OF THE INVENTION

The present invention relates in general to a bipolar transistor and in particular to a double heterojunction bipolar transistor having both emitter-base and base-collector junctions from different semiconductor materials.

BACKGROUND OF THE INVENTION

Heterojunction Bipolar Transistors (HBTs) are known in the art. For example see U.S. Pat. No. 4,768,074 entitled, "Heterojunction Bipolar Transistor Having an Emitter Region with a Band Gap Greater than that of a Base Region" to Yoshida et al. Double Heterojunction Bipolar Transistors (DHBTs) and Double Heterojunction High Electron Transistors (DHETs) are known in the art. For example see U.S. Pat. No. 5,010,382 entitled "Heterojunction Bipolar Transistor Having Double Hetero Structure" to Katoh. DHBTs and DHETs (DHTs) have one heterojunction between the emitter and base region and a second between the base and collector region. DHTs have many advantages over other types of bipolar transistors, such as enhanced emitter injection efficiency, lower base resistance, and lower base-emitter junction capacitance ($C_{jbe}$).

FIG. 1 is a cross-sectional view of a prior art GaAs-AlGaAs HBT 100 structure. The HBT 100 has an n-type GaAs collector layer 102, a p-type GaAs base layer 104, and an n-type $Al_xGa_{1-x}As$ emitter 106 (x is the mole fraction of aluminum in AlGaAs) on an n+-GaAs substrate 108. The emitter 106 has two layers, a thick n⁻-type first emitter layer 106a on the base layer 104 and a thin n+-type second emitter layer 106b on the first emitter layer 106a and contacting emitter electrode 110. Collector electrode 112 contacts the sub-collector layer 108 and base electrode 114 contacts base layer 104.

The lower doping of first emitter layer 106a combined with its thickness reduces $C_{jeb}$ and increases the transistor's switching speed. To further improve transistor performance, the emitter and the collector current density must be at least $10^3$ to $10^4$ Amp/cm². For the prior art HBT of FIG. 1, the reduced doping concentration of the emitter layer 106a reduces carrier injection into the base from the emitter to slow transistor turn-on. Because of this low doping concentration, a high forward-bias voltage $V_{be}$ is applied to the base-emitter junction to increase current density. However, because of this increased $V_{be}$, excess carriers are stored in both the first emitter layer 106a and in collector layer 102. Consequently, the transistor's turn-off time $t_{off}$ increases. Since transistor switching speed is the average of $t_{on}$ and $t_{off}$, a large $t_{off}$ offsets a reduction in $t_{on}$ and, therefore, is unacceptable.

A heterojunction formed from dissimilar semiconductor materials causes a conduction band discontinuity or spike, $\Delta E_c$, and a valence band discontinuity $\Delta E_v$ at the interface of the two materials. $\Delta E_c$ blocks the injection of low-energy carriers from the emitter region into the base region degrading emitter efficiency and, consequently, switching speed. Prior art attempts, e.g., grading the heterojunction, have failed to solve this switching speed degradation problem. For example, see L. F. Eastman, P. M. Enquist, and L. P. Ramberg, "Comparison of Compositionally Graded to Abrupt Emitter-Base Junctions Used in Heterojunction Bipolar Transistor," Journal of Applied Physics, Volume 61, pps. 2663–2669, 1987.

Prior art HBTs and DHBTs also suffer from high junction leakage currents. Several factors contribute to junction leakage, including base electron-hole recombination and laterally diffused carriers injected from the emitter into the extrinsic base. Consequently, HBTs have a lower current gain $\beta$ than would otherwise be expected. Exacerbating this problem is the HBT $\beta$'s non-uniformity, and the further reduction of $\beta$ that results when HBT's are scaled. These problems compound each other, making HBTs unattractive for dense circuit integration.

PURPOSES OF THE INVENTION

It is a purpose of the present invention to reduce the parasitic capacitance between the base and the collector of Double Heterojunction Bipolar Transistors.

It is another purpose of the present invention to reduce base to emitter leakage in Double Heterojunction Bipolar Transistors.

It is still another purpose of the present invention to reduce base resistance in Double Heterojunction Bipolar Transistors.

It is still another purpose of the present invention to reduce lateral current diffusion between the emitter region and the extrinsic base region in Double Heterojunction Bipolar Transistors.

It is still another purpose of the present invention to improve the current gain efficiency of Double Heterojunction Bipolar Transistors.

It is still another purpose of the present invention to reduce parasitic capacitance, reduce base to emitter leakage, reduce base resistance and improve the current gain efficiency of Double Heterojunction Bipolar Transistors.

SUMMARY OF THE INVENTION

A Double Heterojunction Bipolar Transistor (DHBT) comprising: a first layer of a first semiconductor material; a second layer of a second semiconductor material; a third layer of said second semiconductor material; a fourth layer of said first semiconductor material; and a plug in said fourth layer.

BRIEF DESCRIPTION OF THE DRAWINGS

The preferred embodiment of the present invention as claimed in the appended claims and described in the following specification may be better understood with reference to the attached drawings wherein like reference numerals correspond to the same or similar elements and:

DETAILED DESCRIPTION OF THE PREFERRED EMBODIMENT

FIGS. 2A–2I represent the steps in fabricating a Double Heterojunction Bipolar Transistor (DHBT) according to a preferred embodiment of the present invention.

Figure 1:
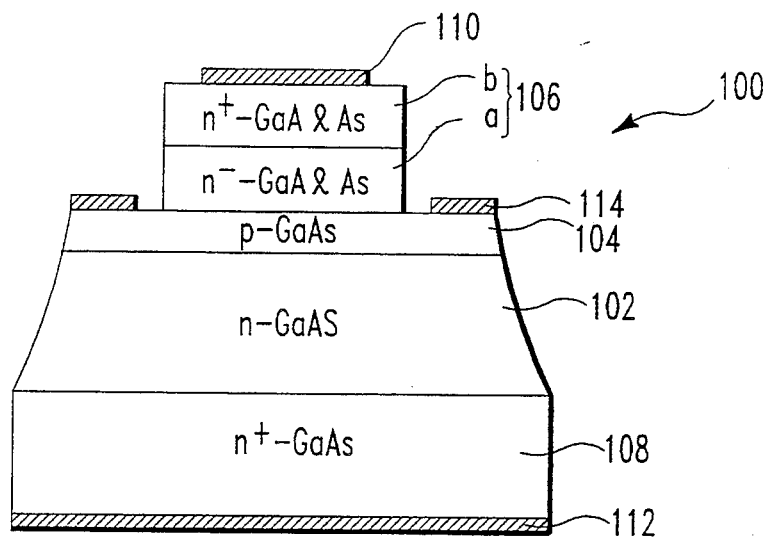
FIG. 1 is a cross sectional view of the prior art single heterojunction bipolar transistor.
Figure 2A:
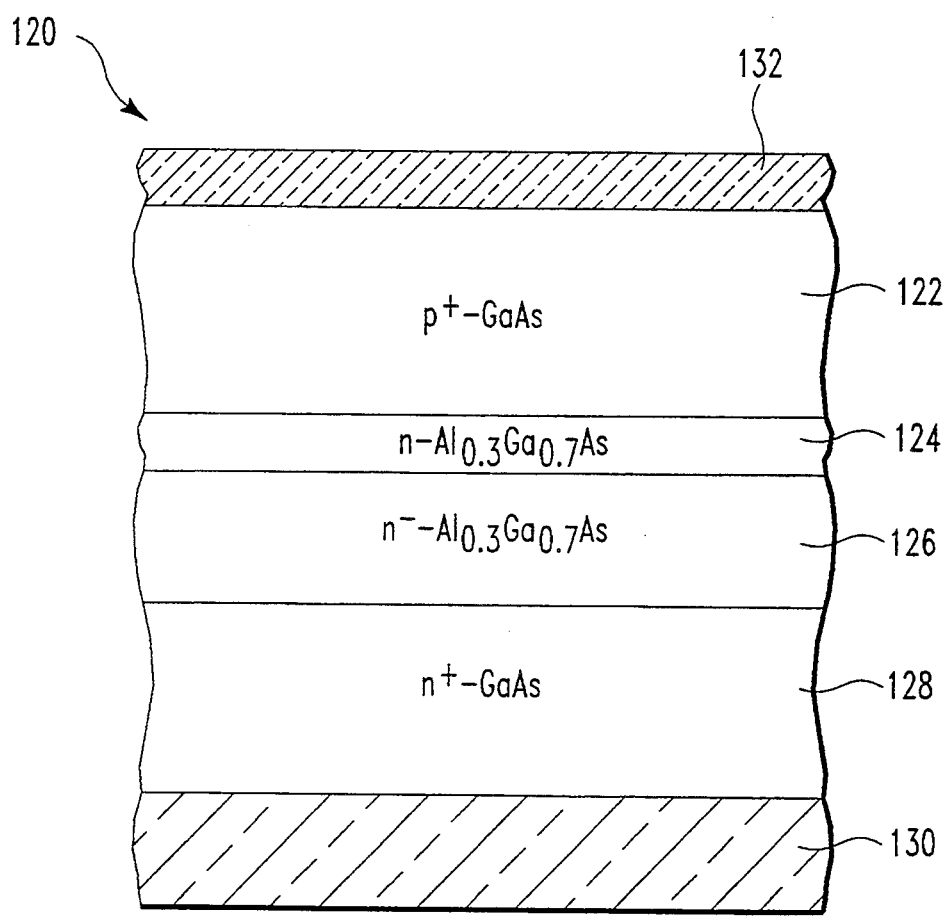
FIGS. 2A to 2I are steps in fabrication of a double heterojunction bipolar transistor according to the preferred embodiment of the present invention.
Figure 2B:
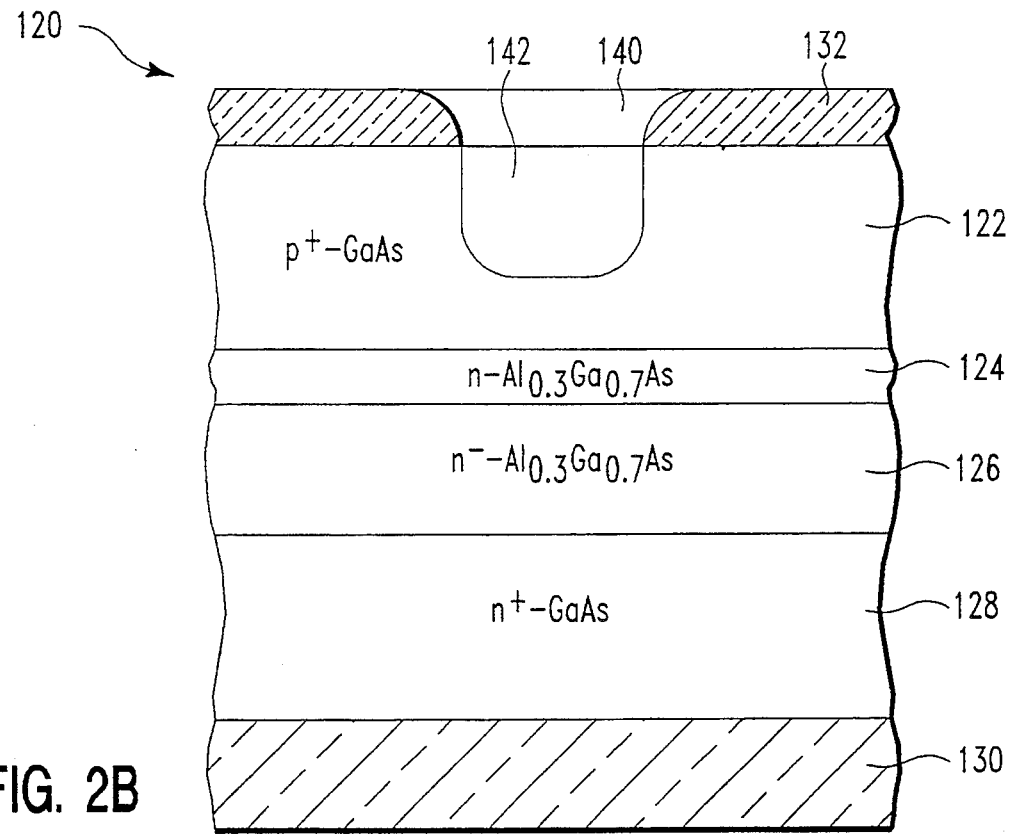
Figure 2C:
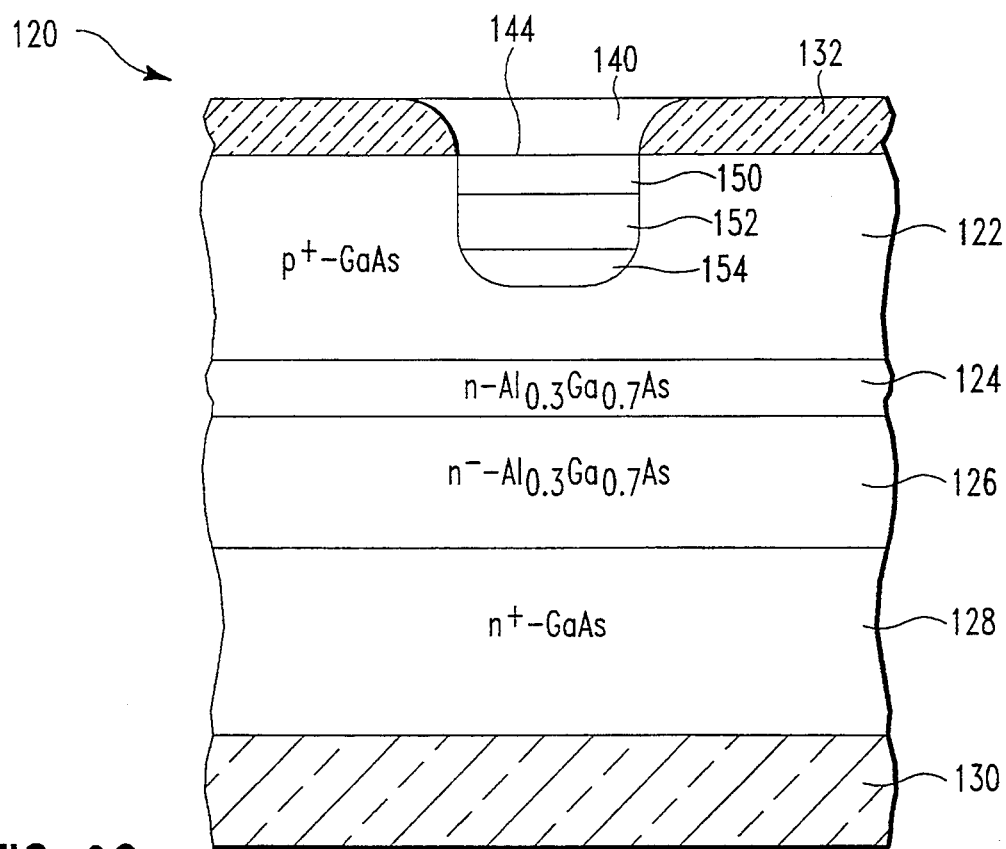

First, in FIG. 2A, the layers of the multilayer wafer 120 are grown by the Molecular Beam Epitaxy (MBE) method. The wafer 120 has a 0.2 $\mu$m p+-GaAs first layer 122 doped to $10^{19}/cm^3$, on a 50–100 Å n-type $Al_{0.3}Ga_{0.7}As$ second layer 124 doped to $10^{17}/cm^3$, on a 0.5 $\mu$m n--$Al_{0.3}Ga_{0.7}As$ third layer 126 doped to $5 \times 10^{16}/cm^3$, and a 0.5 $\mu$m n+-GaAs fourth layer 128 doped to $5 \times 10^{18}/cm^3$ on a Semi-insulating fifth layer 130. A 0.3 $\mu$m $SiO_2$ layer 132 is deposited on the wafer by the Chemical Vapor Deposit (CVD) or, alternatively, by a sputtering method.

An emitter pattern is formed in photoresist using a conventional photoresist technique. The emitter's photoresist pattern provides an etch mask for etching the $SiO_2$ film 132. Area 140 is formed in the $SiO_2$ in FIG. 2B by reactive ion etching (RIE) with $CF_4$ gas as represented to expose the p+-GaAs layer 122. Next, a 0.20 $\mu$m concave portion 142 is etched into the exposed p+-GaAs layer 122 by a selective dry etching method using an etchant gas mixture of carbon dichlorodifluoride $CCl_2F_2$ and helium (He). After etching the concave portion 142, a tri-layered plug 144 of layers of n-GaAs and n-$Al_{0.3}Ga_{0.7}As$ is selectively grown in the concave portion 142. The plug top layer 150 is a 0.05 $\mu$m thick n-type GaAs layer doped to $3 \times 10^{17}$ cm$^{-3}$. The middle plus layer 152 is a 0.10 $\mu$m n-type $Al_{0.3}Ga_{0.7}As$ layer doped to $2 \times 10^{17}$ cm$^{-3}$. The bottom plus layer 154 is a 0.05 $\mu$m n-type $Al_{0.3}Ga_{0.7}As$ layer doped to $10^{17}$ cm$^{-3}$. After growing these three plug layers using a Metal Oxide Chemical Vapor Deposition (MOCVD) method, any excess semiconductor on the $SiO_2$ layer 132 can be cleaned away with an etchant such as sulfuric acid.

Figure 2D:
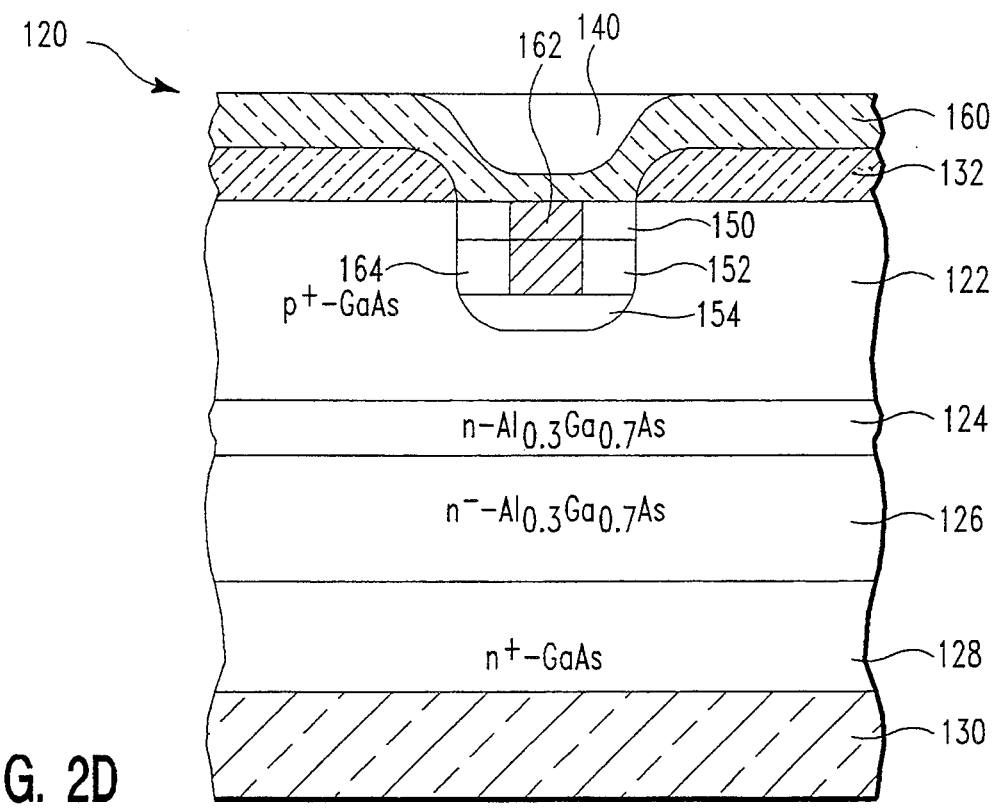

Next, a second $SiO_2$ layer 160 in FIG. 2D, 0.2 $\mu$m thick, is grown on the first $SiO_2$ layer 132, and covering top emitter layer 150 in opening 140. Si ions are blanket ion-implanted, penetrating the second $SiO_2$ layer 160, but blocked by the combined thickness of the first $SiO_2$ layer 132 and the second $SiO_2$ layer 160 (0.50 $\mu$m). So, Si ion-implantation is limited in the plug 144 to area 162 with limited Si implantation in those regions of 150 and 152 blocked by any $SiO_2$ thicker than the second layer 160 and, therefore, blocked outside of area 162. Further, the second layer 160 minimizes surface damage to top emitter layer 150.

Figure 2E:
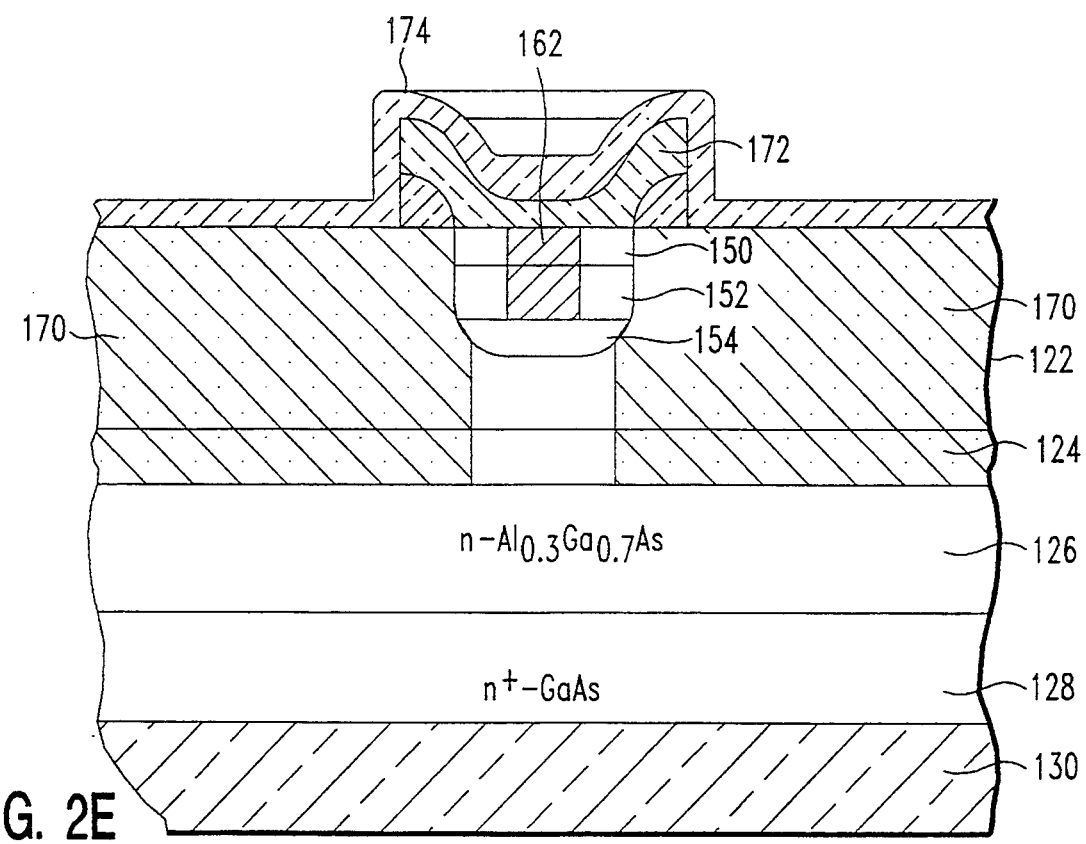

The next step is forming an extrinsic base region 170 in FIG. 2E. First, the two $SiO_2$ layers 132 and 160 are selectively etched using $CF_4$, so that the emitter, plus layers 150, 152 and 154 remain covered by $SiO_2$ portion 172. Next, a 0.1 $\mu$m $SiO_2$ third layer 174 is formed on the wafer surface 120. Then, Mg is ion-implanted into the wafer 100 at a dose of $2 \times 10^{14}/cm^2$ and energy level of 200 KeV to a depth of 0.35 $\mu$m. The Mg ions reach the interface of layers 124 and 126 where a new p++-GaAs region will be formed as base region 170. As a result of Mg ion-implantation, a portion of n-type $Al_{0.3}Ga_{0.7}As$ layer 124 also will be converted to p++-type. However, the $SiO_2$ layers 172 and 174 mask the emitter region 140, restricting Mg ion implantation to the base 170 region. Finally, the implanted wafer 120 is annealed at 800° C. with an infra-red lamp. Annealing activates the Mg ions, forming the base region 170 p++-type.

Figure 2F:
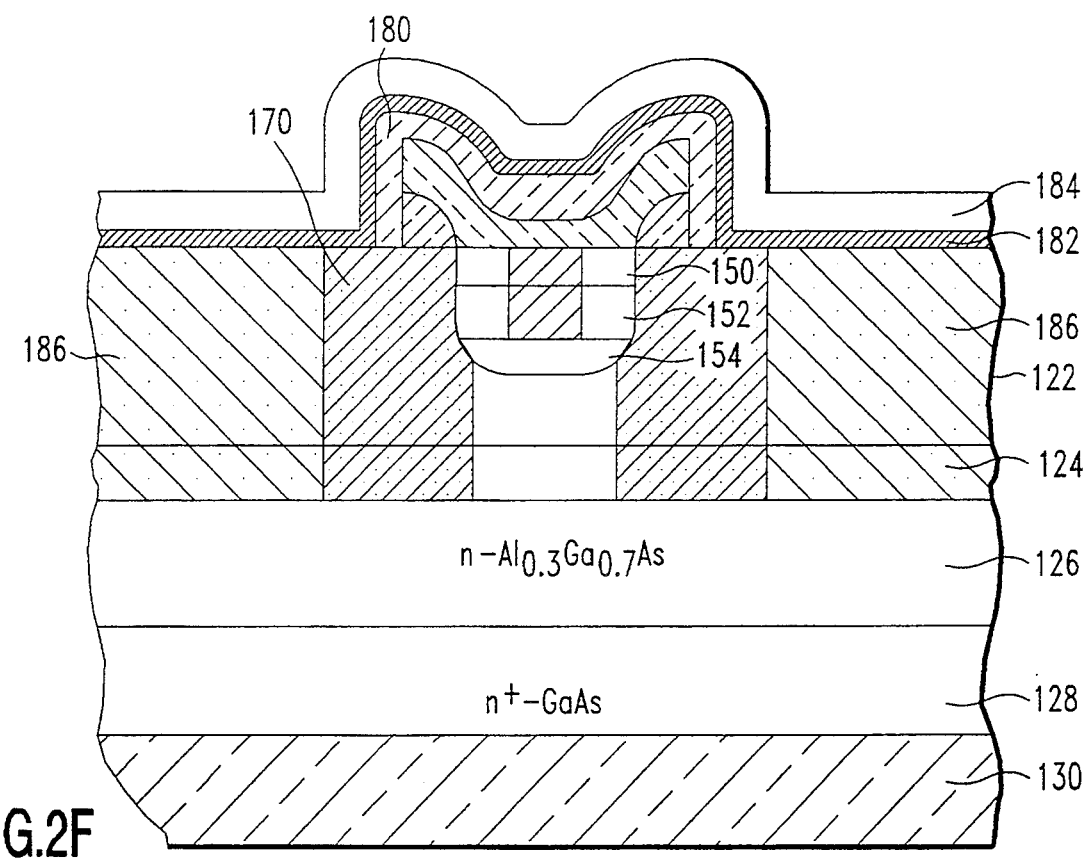

After forming the base region 170, layer 174 is etched away from the base region 170 by $CF_4$ anisotropic RIE, leaving only portion 180 in FIG. 2F. A 500 Å $Si_3N_4$ film 182 is deposited on the wafer by Plasma-CVD (P-CVD) and a 0.2 $\mu$m thick fourth $SiO_2$ layer 184 is formed on the $Si_3N_4$ film 182. Boron ions are implanted at 150 KeV through the $SiO_2$ film 184 and $Si_3N_4$ film 182 to a dose of $1 \times 10^{13}$ cm$^{-2}$ to form a high resistance layer 186.

Figure 2G:
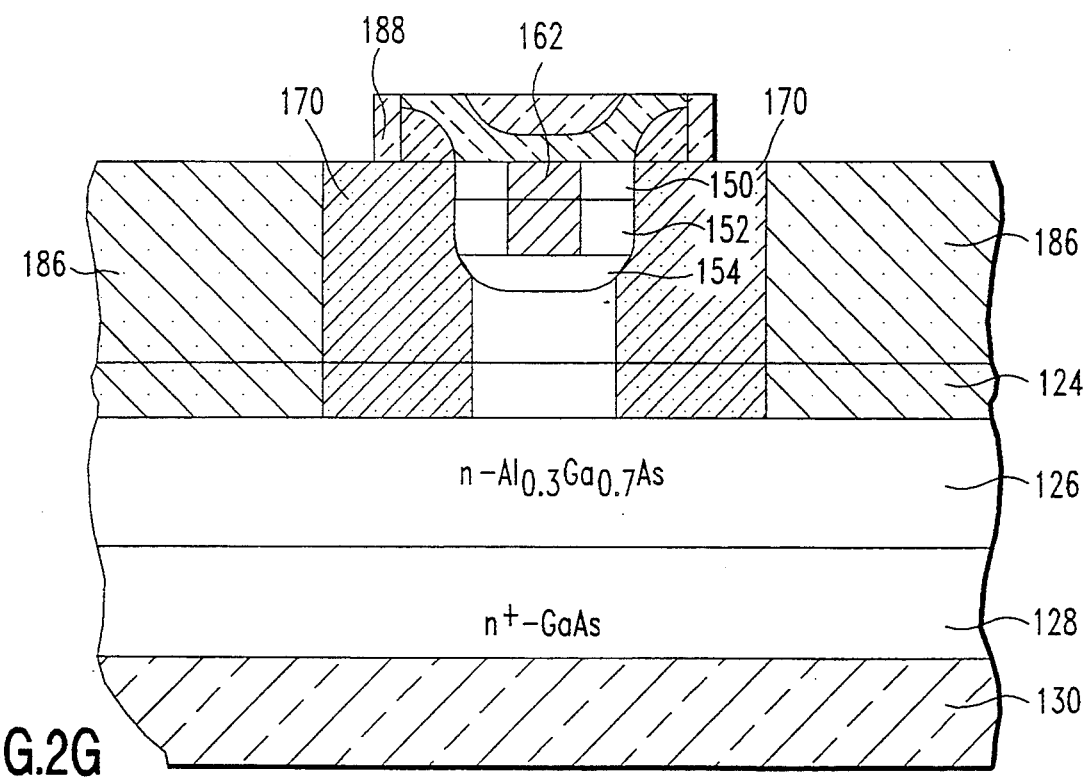

After forming the high resistance layer 186, the $SiO_2$ layer 184 is removed with buffered hydrofluoric acid and the $Si_3N_4$ film 182 is removed with $O_2 + CF_4$ plasma leaving a cap 188 in FIG. 2G. Then, a portion of the $SiO_2$ cap 188 is removed by buffered hydrofluoric acid to leave the structure in FIG. 2H.

Figure 2H:
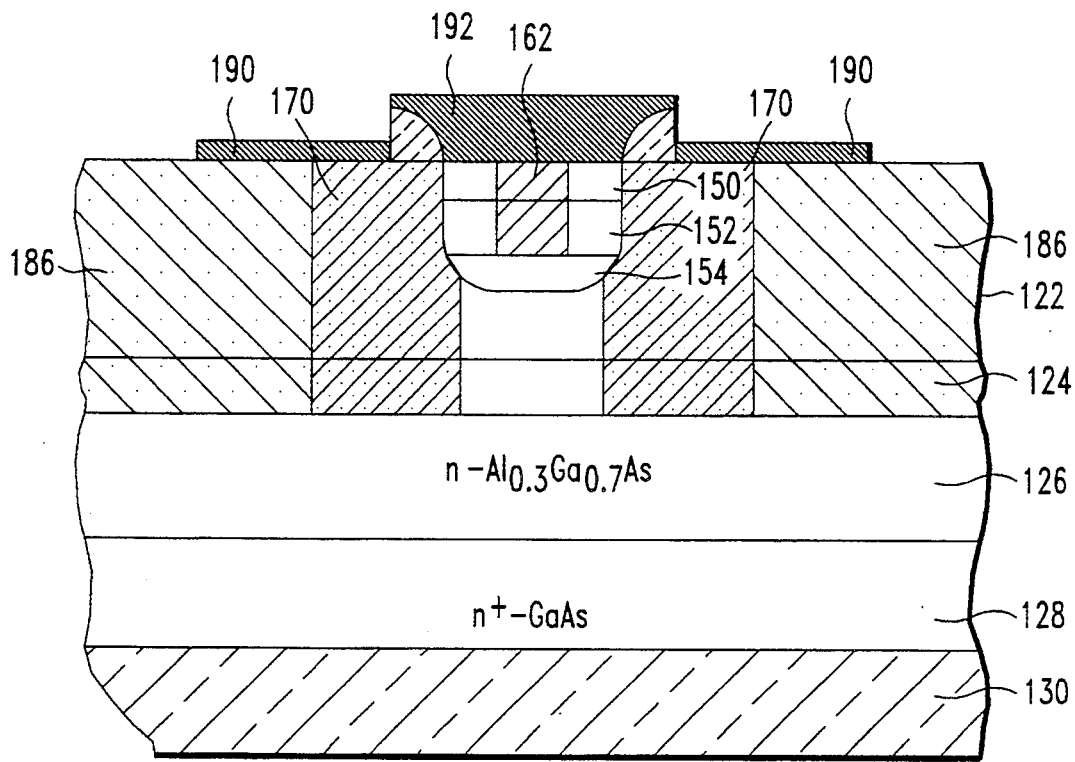
Figure 2I:
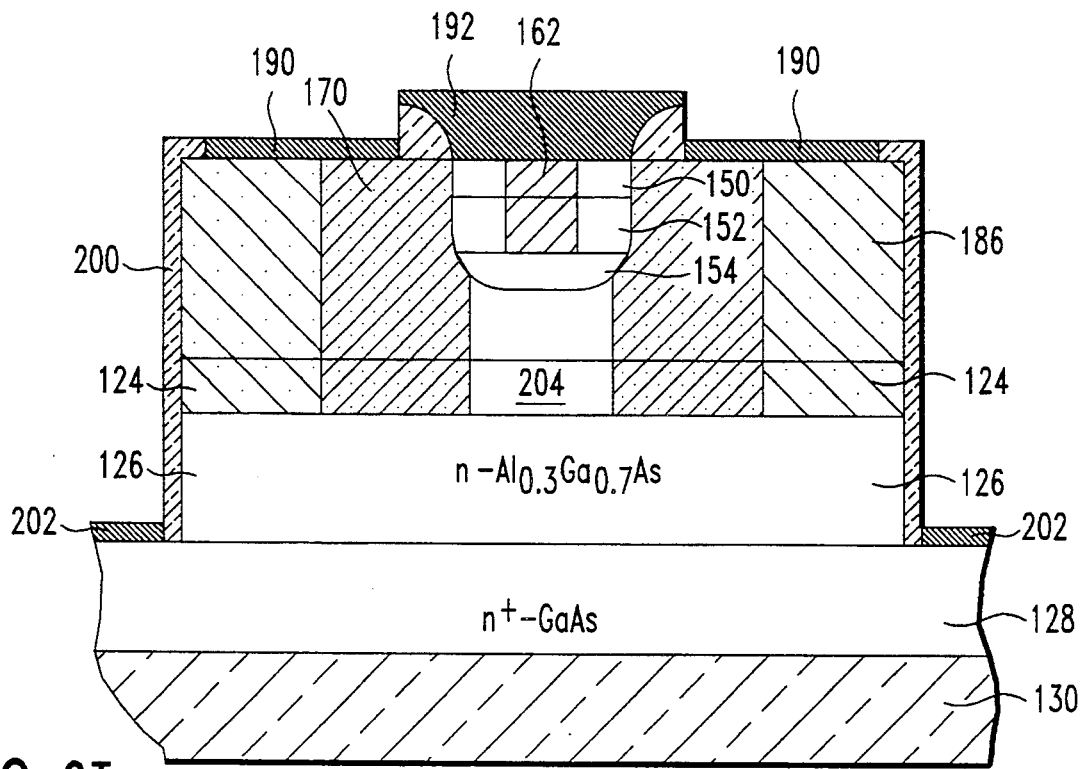

On the structure in FIG. 2H resistive electrodes are formed. The base electrode 190 is formed by depositing an AuZn alloy on the wafer and, then, etching the alloy with a mixture of iodine and potassium iodide to expose regions 170 and 186. The emitter electrode 192 is formed by removing enough $SiO_2$ to expose the extrinsic base 162 and then selectively depositing AuZn. After forming emitter electrode 192, the wafer is annealed at 400° C. so that emitter electrode 192 and n+-GaAs 150 both form ohmic electrodes. The collector electrode, 202 as shown in FIG. 2I, is formed by selectively dry etching the GaAs layer 119 with a mixture of the $CCl_2F_2$ and $H_2$ with layer 126 acting as an etch stop. The exposed portion of $Al_{0.3}Ga_{0.7}As$ layer 126 is wet etched using an etchant solution of $NH_4OH$—$H_2O_2$—$H_2O$ to expose n+ GaAs layer 128. A layer of 200 of $SiO_2$ is selectively deposited to mask the collector electrode 202, which is a metal alloy deposited on the exposed area of layer 128.

In the preferred embodiment of the present invention, the emitter has two regions, emitter region II 152 and emitter region I 154. These two emitter regions 152 and 154, are surrounded by heavily doped extrinsic base region 170, which is of opposite conductivity type. Consequently, the p++-type extrinsic base 170 and n-type emitter regions 152 and 154 prevent emitter carriers (electrons) from entering the extrinsic base region 170.

Figure 3:
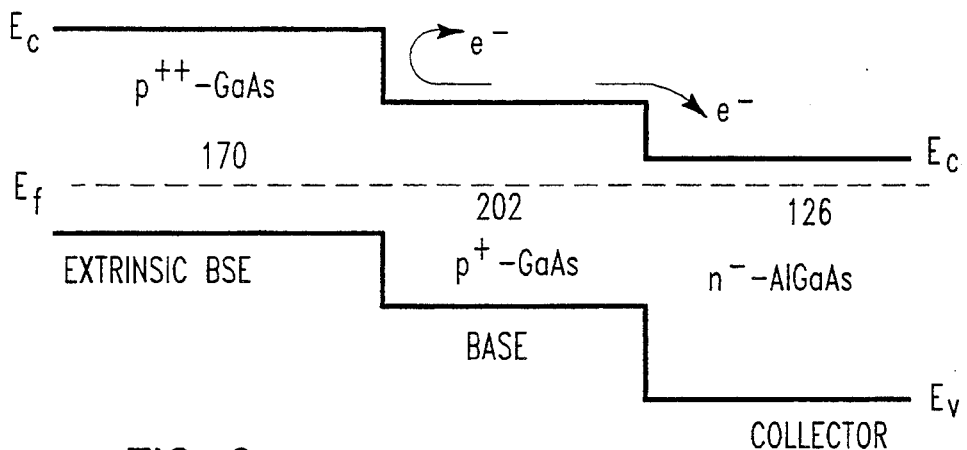
FIG. 3 is a band gap diagram for a portion of the preferred embodiment DHBT.

Additionally, the extrinsic base 170, which is far more heavily doped than the intrinsic base 204, separates the intrinsic base 204 from the $SiO_2$ surface (between the emitter and the base contact). Consequently, the extrinsic base creates the potential barrier represented in the valance band diagram of FIG. 3. Thus, when the base-collector junction is reverse biased, minority carriers are prevented from reaching the $SiO_2$ surface between the emitter and the base contact. High energy barriers at both sides force the emitter current to flow mainly through the interior portion 162 of the emitter and (intrinsic) base 204 improving both emitter efficiency and dc current gain $\beta$.

Figure 4A:
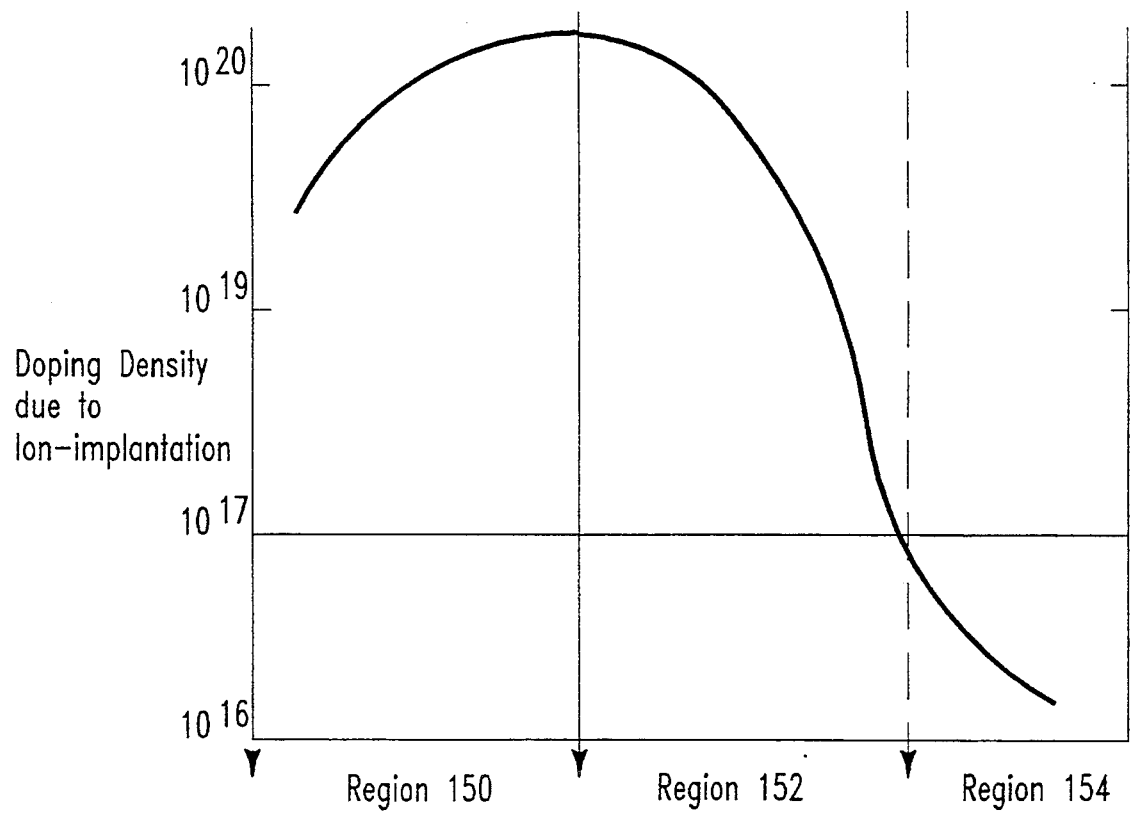
FIGS. 4A and 4B are doping profile diagrams of the preferred embodiment DHBT.
Figure 4B:
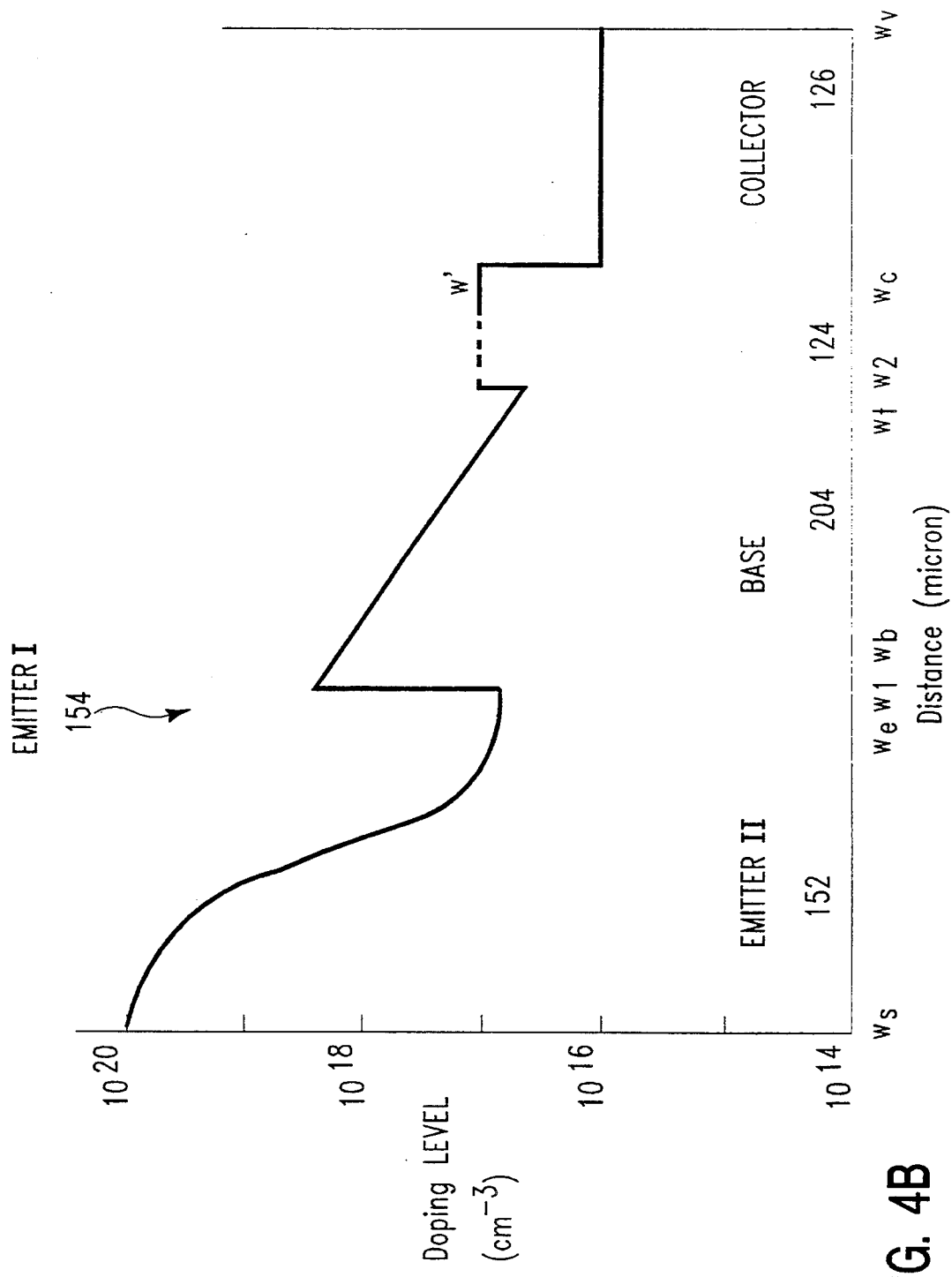

The preferred density of emitter dopant Si is provided in FIG. 4A. With the emitter ion-implanted to the dopant profile of FIG. 4A, the DHBT dopant profile of the preferred embodiment will be as in FIG. 4B. The dopant level is low in the collector region 126 (i.e., $10^{16}$ cm$^{-3}$), and high for the intrinsic base region 202 (i.e., $5 \times 10^{18}$ cm$^{-3}$).

The thin layer 124 between the base 204 and collector 126 creates an electric field at that junction. This electric field reduces the electron blocking effect that plagued prior art graded base-collector junctions. Consequently, for the preferred embodiment, almost all of the base minority carriers are swept into the collector to the collector electrode, resulting in a significant increase in collector current $I_c$ over prior art DHBT's. Also, base to emitter junction capacitance is reduced, because the depletion layer at the base-emitter junction encroaches very little of the emitter region. Base to collector capacitance is also low, because the dopant density at least in one side of the base-collector junction is low. Thus, device capacitances for the preferred embodiment DHBT have been reduced over the prior art.

While the present invention has been described in terms of a preferred embodiment, numerous modifications and alterations will occur to a person of ordinary skill in the art without departing from the scope and spirit of the invention.

I claim:

1. A method of manufacturing a Double Heterojunction Bipolar Transistor (DHBT), said method comprising the steps of:
   a) growing a layered wafer comprising the steps of:
      i) growing a first layer of a first semiconductor material on a substrate, said first layer being doped with a first donor type dopant,
      ii) growing a second layer of a second semiconductor material on said first layer, said second layer being doped with said first donor type dopant at a first dopant concentration;
      iii) growing a third layer of said second semiconductor material on said second layer, said second layer being doped with said first donor type dopant at a second dopant concentration, and
      iv) growing a fourth layer of said first semiconductor material on said third layer, said fourth layer being doped with a second donor type dopant;
   b) etching a trench in said layered wafer;
   c) growing a plug in said trench;
   d) doping a core region of said plug;
   e) doping an extrinsic base region in said layered wafer; and
   f) forming a base contact, an emitter contact, and a collector contact.

2. The method of claim 1 further comprising the step of:
   v) growing an oxide layer on said fourth layer.

3. The method of claim 2 wherein said first semiconductor material is GaAs and said second semiconductor material is AlGaAs.

4. The method of claim 3 wherein said first donor type is n-type and said second donor type is p-type.

5. The method of claim 1 wherein said plug is a layered plug and the step (c) of growing said plug comprises the steps of:
   i) growing a bottom plug layer of a first semiconductor material in said trench;
   ii) growing a middle plug layer of said first semiconductor material on said bottom plug layer; and
   iii) growing a top plug layer of a second semiconductor material.

6. The method of claim 5 wherein said bottom plug layer is doped at a first dopant concentration, said middle plug layer is doped at a second concentration and said top plug layer is doped at a third concentration.

7. The method of claim 1 wherein the step (d) of doping the plug core region includes growing a layer of oxide over said layered wafer and said plug.

8. The method of claim 7 wherein the step (e) of doping the extrinsic base region includes the steps of:
   i) etching oxide to expose a semiconductor layer of said layered wafer;
   ii) growing an oxide layer on said etched surface, said grown oxide layer covering said layered wafer and any oxide remaining on said plugs; and
   iii) ion-implanting a dopant into said layered wafer.

9. The method of claim 8 wherein the step (e) of doping the extrinsic base region further comprise the steps of:
   iv) etching oxide to expose a surface of said layered wafer;
   v) depositing a nitride layer over said exposed surface and any oxide on said plugs and said layered wafer;
   vi) depositing a top oxide layer on said nitride layer; and
   vii) ion-implanting said layered wafer.

10. The method of claim 1 wherein the step (f) of providing contacts comprises the steps of:
    i) selectively depositing metal contacts on said plug and said extrinsic base region;
    ii) selectively etching said layered wafer to expose a collector layer;
    iii) selectively depositing an oxide layer on an exposed transistor sidewall; and
    iv) selectively depositing metal on said exposed collector layer.

11. The method of claim 9 wherein the step (f) of providing contacts comprises the steps of:
    i) removing said top oxide layer and said nitride layer;
    ii) selectively removing said oxide to expose a top surface of said plug;
    iii) selectively depositing metal on said top surface of said plug and on said surface of said layered wafer;
    iv) selectively etching said layered wafer to expose a collector layer;
    v) selectively depositing an oxide layer on an exposed transistor sidewall; and
    vi) selectively depositing metal on said exposed collector layer.

* * * * *